| United States Patent [19] | [11] 4,032,418 |
| Antula | [45] June 28, 1977 |

[54] METHOD OF INTRODUCING IMPURITIES INTO A SEMICONDUCTOR

[76] Inventor: Jovan Antula, 19, Trappentreu St., Munich, Germany, D-8000

[22] Filed: July 7, 1975

[21] Appl. No.: 593,486

[30] Foreign Application Priority Data

Jan. 16, 1975 Germany .......................... 2501621

[52] U.S. Cl. .................................. 204/130; 204/140
[51] Int. Cl.² .......................................... C25D 11/00
[58] Field of Search ........................... 204/130, 140

[56] References Cited

UNITED STATES PATENTS

| 2,560,792 | 7/1951 | Gibney .............................. 204/140 |
| 3,261,773 | 7/1966 | Sandmann, et al. .............. 204/242 |
| 3,380,902 | 4/1968 | Weiss ................................ 204/140 |
| 3,385,776 | 5/1968 | Fiedler ............................. 204/130 |
| 3,755,092 | 8/1973 | Antula .............................. 204/35 N |

FOREIGN PATENTS OR APPLICATIONS

| 1,939,267 | 2/1971 | Germany .......................... 204/130 |

*Primary Examiner*—T. M. Tufariello
*Attorney, Agent, or Firm*—Flynn & Frishauf

[57] ABSTRACT

A method of manufacturing a p-n, $n^+$-n or $p^+$-p junction in a semiconducting material, introducing into said material ions of an impurity material by exposing a surface of said semiconductor to a liquid containing ions of said impurity material, applying a voltage across said semiconductor-liquid interface, said voltage having a polarity and magnitude such that said ions are accelerated and drawn into said semiconducting material without the formation of a deposit of said impurity material on said exposed surface being necessary.

11 Claims, No Drawings

METHOD OF INTRODUCING IMPURITIES INTO A SEMICONDUCTOR

The conventional means for doping semiconductor bodies with impurity materials of a given conductance character are generally based upon an alloying, diffusion or ion implantation process.

A new method is provided for introducing ions of impurity material into a semiconductor from a liquid containing said ions (electrolyte). This method of doping is simple and reliable.

An object of the invention is to provide a p-n junction in a semiconducting material by applying this method.

A further object of the invention is to provide a $p^+$-p or $n^+$-n junction in a semiconducting material.

These and other objects, features and advantages of this invention will be apparent from the following detailed description:

The end zone of the lattice at the surface of a monocrystalline semiconductor gives rise to the well-known space charge region below the surface. A electrolyte, containing ions of the impurity material contacts the surface. When a voltage of a polarity and magnitude such that said ions are accelerated to and drawn into said space-charge region of the semiconductor is applied across the semiconductor - electrolyte interface a doping effect is obtained without a deposit of said impurity material on said surface being necessary.

The described method can be used to provide a p-n, $p^+$-p or $n^+$-n junction in silicon material, as well as in other elemental semiconducting materials or in $A^{III}$-$B^V$ (e.g. GaAs, InP) or other compound semiconductors.

To provide a p-n or a p-$p^+$ junction in a silicon material of p-type (doped, for example, with boron), the silicon body is connected to the negative terminal of a d.c. voltage source for electrolysis. The electrolyte, containing positive ions of the impurity material (donors for p-n junction or acceptors for p-$p^+$ junction), is connected to the negative terminal of said source. In the case of n-type silicon material, the positive acceptor or donor ions would provide an n-p or an n-$n^+$ junction, respectively. In the case of doping with negative ions of the said impurity material, the polarity of the said d.c. voltage source should be reversed.

The polarity of the voltage applied to the semiconductor material thus has a polarity which is effectively opposite to the conductivity type of the semiconductive material. As a result of the voltage, a zone of depleted charge carriers will occur at the surface in contact with the electrolyte. The electrolyte will contain ions of the doping material which has the same charge as the conductivity type of the semiconductive material.

A silicon crystal is placed at the narrow end of a funnel-shaped electrolyte container, so that only one surface, which may be polished of the crystal is in contact with the electrolyte. The electrical doping occurs at temperatures below 60° C, preferably below 30° C. The typical current density during the electrolysis is 0.5 to 5 $\mu A/mm^2$, the typical voltage across the siliconelectrolyte junction is below 10 V.

For doping with arsenic in purest form from an electrolyte, it is preferable to use an aqueous solution of $As_2O_3$ in HCl (35%).

In the case of lithium it has been found preferable to provide means for performing the electrolysis in an oxygen-free medium, e.g. in a nitrogen atmosphere. A non-aqueous electrolytic solution of lithium perchlorate in propylene carbonate can be used with success.

It will be understood that the above description of the present invention is susceptible to various modifications, changes and adaptions, and the same are intended to be comprehended within the meaning and range of equivalence of the appended claims.

I claim:

1. A method for doping a surface zone of a doped semiconducting material with an impurity material to provide a junction (p-n or p-$p^+$ or p-$n^+$) within the doped semiconductor material comprising the steps of
    contacting a surface portion of said doped semiconducting material with a liquid containing ions of said impurity material, at the temperature of below 60° C to form a doped semiconductor-material - ion containing liquid interface;
    placing an electrode connected to one terminal of a d-c source within said liquid and connecting the opposite polarity terminal of the d-c source to another surface portion of said doped semiconducting material;
    and forming a depletion layer to permit migration of ions thereinto from said ion containing liquid through said interface and thus form said junction by applying a d-c voltage from said source to said terminal and hence across said doped semiconducting material - ion-containing liquid interface, said voltage having a polarity and magnitude to form the zone of depleted charge carriers in the semi-conductor material adjacent the surface in contact with the electrolyte and to accelerate said ions from said ion containing liquid into said doped semi-conducting material.

2. The method according to claim 1 wherein the temperature of said liquid is below 30° C.

3. The method according to claim 1 wherein said semiconducting material is silicon.

4. The method according to claim 1 wherein said liquid contains positive arsenic ions obtained by dissolving $As_2O_3$ in HCl.

5. The method according to claim 1 wherein said liquid contains positive lithium ions obtained by dissolving lithium perchlorate in propylene carbonate.

6. The method according to claim 1 wherein said surface of said semiconducting material is polished.

7. Method for doping a surface zone of a doped semiconducting material with an impurity to provide a junction (p-n; p-$p^+$; n-$n^+$) within the semiconducting material comprising the steps of
    contacting the surface of said semiconducting material with a liquid containing ions of said impurity material at a temperature of below 60° C;
    and forming a depletion layer to permit migration of ions thereinto from said ion containing liquid through said interface and thus form said junction by
    applying a direct electrical potential between the semiconducting material and the liquid to establish a voltage across the semiconductor-liquid interface, said electrical potential having the characteristics of
    a. a polarity and magnitude to accelerate the ions of said impurity material to migrate into the charge carrier depleted surface zone of said doped semiconducting material, and b. the polarity of the terminal of said potential applied to said doped semiconducting material being opposite to the conductivity type of the doped semiconducting material so that the surface area in contact with the electrolyte will define within the doped semiconducting material a zone which is depleted of charge carriers, the ions of the impurity material in the liquid having a charge polarity which corresponds to the conductivity type of the doped semiconducting material.

8. Method accordng to claim 7, wherein the temperature of said liquid is below 30° C.

9. Method according to claim 7, wherein said liquid contains positive arsenic ions obtained by dissolving $As_2O_3$ in HCl.

10. Method according to claim 7, wherein said liquid contains positive lithium ions obtained by dissolving lithium perchlorate in propylene carbonate.

11. Method according to claim 7 wherein the semiconductor material is p-silicon, the impurity material comprises a material selected from the group of arsenic and lithium to provide positive ions, the p-type silicon being connected to the negative terminal of the direct electrical potential, the positive terminal of the direct electrical potential being connected to the liquid containing said impurities.

* * * * *